(12) United States Patent
Nozawa

(10) Patent No.: US 10,290,523 B2
(45) Date of Patent: May 14, 2019

(54) WAFER PROCESSING APPARATUS, RECORDING MEDIUM AND WAFER CONVEYING METHOD

(71) Applicant: ASM IP Holding B.V., Almere (NL)

(72) Inventor: Toshihisa Nozawa, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 214 days.

(21) Appl. No.: 15/461,950

(22) Filed: Mar. 17, 2017

(65) Prior Publication Data

US 2018/0269088 A1    Sep. 20, 2018

(51) Int. Cl.
*H01L 21/67* (2006.01)
*H01L 21/677* (2006.01)
*H01L 21/68* (2006.01)
*G05B 19/418* (2006.01)

(52) U.S. Cl.
CPC .. *H01L 21/67201* (2013.01); *G05B 19/41815* (2013.01); *H01L 21/67167* (2013.01); *H01L 21/67173* (2013.01); *H01L 21/67207* (2013.01); *H01L 21/67225* (2013.01); *H01L 21/67259* (2013.01); *H01L 21/67742* (2013.01); *H01L 21/68* (2013.01); *G05B 2219/2602* (2013.01); *Y02P 90/02* (2015.11); *Y02P 90/083* (2015.11); *Y10S 901/40* (2013.01)

(58) Field of Classification Search
CPC ......... H01L 21/67201; H01L 21/67167; H01L 21/67173; H01L 21/67207; H01L 21/67225; H01L 21/67259; H01L 21/67742; H01L 21/68; G05B 19/41815; G05B 2219/2602; Y02P 90/02; Y02P 90/083; Y10S 901/40

USPC ......................................................... 700/114
See application file for complete search history.

(56) References Cited

U.S. PATENT DOCUMENTS

| | | | | |
|---|---|---|---|---|
| 6,152,070 A | * | 11/2000 | Fairbairn | H01L 21/67201 118/719 |
| 6,430,468 B1 | * | 8/2002 | Tepman | H01L 21/67748 414/222.04 |
| 6,577,923 B1 | * | 6/2003 | White | H01L 21/67259 118/715 |
| 2009/0142163 A1 | * | 6/2009 | Genetti | H01L 21/67196 414/217 |
| 2012/0325148 A1 | | 12/2012 | Yamagishi et al. | |
| 2017/0018446 A1 | * | 1/2017 | Yin | H01L 21/68707 |

FOREIGN PATENT DOCUMENTS

JP    WO2013/088547 A1    6/2013

* cited by examiner

*Primary Examiner* — Kenneth M Lo
*Assistant Examiner* — Michael W Choi
(74) *Attorney, Agent, or Firm* — Studebaker & Brackett PC

(57) ABSTRACT

A wafer processing apparatus includes a controller connected to a first robot and a second robot. The controller controls the first robot so that the wafer is placed on a first load lock stage in such a way that the center of the wafer is shifted from the center of the first load lock stage by a first position shift amount and another wafer is placed on a second load lock stage in such a way that the center of the wafer is shifted from the center of the second load lock stage by a second position shift amount. The controller controls the second robot so that the second robot simultaneously conveys two wafers between the first and second load lock stages, and a first processing stage and a second processing stage.

16 Claims, 12 Drawing Sheets

WAFER PROCESSING APPARATUS, RECORDING MEDIUM AND WAFER CONVEYING METHOD

BACKGROUND OF THE INVENTION

Field of the Invention

The present invention relates to a wafer processing apparatus used for wafer processing, a recording medium and a wafer conveying method.

Background Art

There are wafer processing apparatuses provided with a plurality of chamber modules. One chamber module is provided with two reactor chambers, for example. A chamber module provided with two reactor chambers is called a "DCM (dual chamber module)." A chamber module provided with four reactor chambers is called a "QCM (quad chamber module)." Each reactor chamber is provided with a processing stage.

US 2012/0325148 discloses provision of two wafers to a chamber module using a robot arm that holds the two wafers or unloading of the two wafers from the chamber module, and so on. Considering the fact that a positional relationship between two processing stages in one chamber module is shifted from a predetermined position, US 2012/0325148 further discloses that one wafer is aligned to be accurately placed on the one processing stage first and the other wafer is then aligned to be accurately placed on the other processing stage. Alignment is made possible by measuring the position of the wafer on the robot arm. In this way, the two wafers are mounted at predetermined positions of the processing stages.

When introducing wafers to the chamber module, it is required to rapidly convey the wafers and accurately convey the wafers to predetermined places on the processing stages. Rapidly conveying the wafers improves throughput. Conveying the wafers to accurate positions on the processing stages contributes to processing on the wafers being performed uniformly.

According to the technique described in US 2012/0325148, however, wafer positions are adjusted in the chamber module, one wafer at a time, and it is therefore not possible to convey the wafers rapidly. Moreover, since the wafer positions are adjusted with the robot arm being extended, the robot arm is vibrated, and it takes time until the vibration converges and the wafer positions become stable. In this way, it takes time to convey wafers.

SUMMARY OF THE INVENTION

The present invention has been implemented to solve the above-described problems, and it is an object of the present invention to provide a wafer processing apparatus, a recording medium and a wafer conveying method that can achieve both of rapid conveyance of a wafer and accurate conveyance of the wafer to a predetermined position on a processing stage.

The features and advantages of the present invention may be summarized as follows.

According to one aspect of the present invention, a wafer processing apparatus includes a first robot that conveys a wafer, a load lock apparatus that includes a first load lock stage and a second load lock stage and is provided within a moving range of the first robot, a chamber module that includes a first processing stage and a second processing stage, a second robot that simultaneously conveys two wafers between the first load lock stage and the second load lock stage, and the first processing stage and the second processing stage, and a controller that controls the first robot to place the wafer on the first load lock stage so that a center of the wafer is shifted from a center of the first load lock stage by a first position shift amount which is a position shift corresponding to the load lock apparatus of the first processing stage, and place another wafer on the second load lock stage so that a center of the wafer is shifted from a center of the second load lock stage by a second position shift amount which is a position shift corresponding to the load lock apparatus of the second processing stage.

According to another aspect of the present invention, a computer readable recording medium that records a program, the program causing a computer to execute a checking step of checking a first position shift amount which is a position shift of a first processing stage with respect to a load lock apparatus having a first load lock stage and a second load lock stage, and a second position shift amount which is a position shift with respect to the load lock apparatus of a second processing stage provided adjacent to the first processing stage, a wafer center detection step of detecting a center of the wafer, a shift mounting step of placing a wafer on the first load lock stage so that a center of the wafer is shifted from a center of the first load lock stage by the first position shift amount and placing another wafer on the second load lock stage so that a center of the wafer is shifted from a center of the second load lock stage by the second position shift amount, and a mounting step of placing the wafer on the first load lock stage on the first processing stage simultaneously with placing the wafer on the second load lock stage on the second processing stage.

According to another aspect of the present invention, a wafer conveying method includes a checking step of checking a first position shift amount which is a position shift of a first processing stage with respect to a load lock apparatus having a first load lock stage and a second load lock stage, and a second position shift amount which is a position shift with respect to the load lock apparatus of a second processing stage provided adjacent to the first processing stage, a center detection step of detecting a center of the wafer, a shift mounting step of placing a wafer on the first load lock stage so that a center of the wafer is shifted from a center of the first load lock stage by the first position shift amount and placing another wafer on the second load lock stage so that a center of the wafer is shifted from a center of the second load lock stage by the second position shift amount, and a mounting step of placing the wafer on the first load lock stage on the first processing stage simultaneously with placing the wafer on the second load lock stage on the second processing stage.

Other and further objects, features and advantages of the invention will appear more fully from the following description.

BRIEF DESCRIPTION OF THE DRAWINGS

FIG. 14 is a diagram illustrating the sensor or the like;

DETAILED DESCRIPTION OF THE PREFERRED EMBODIMENTS

Figure 1:
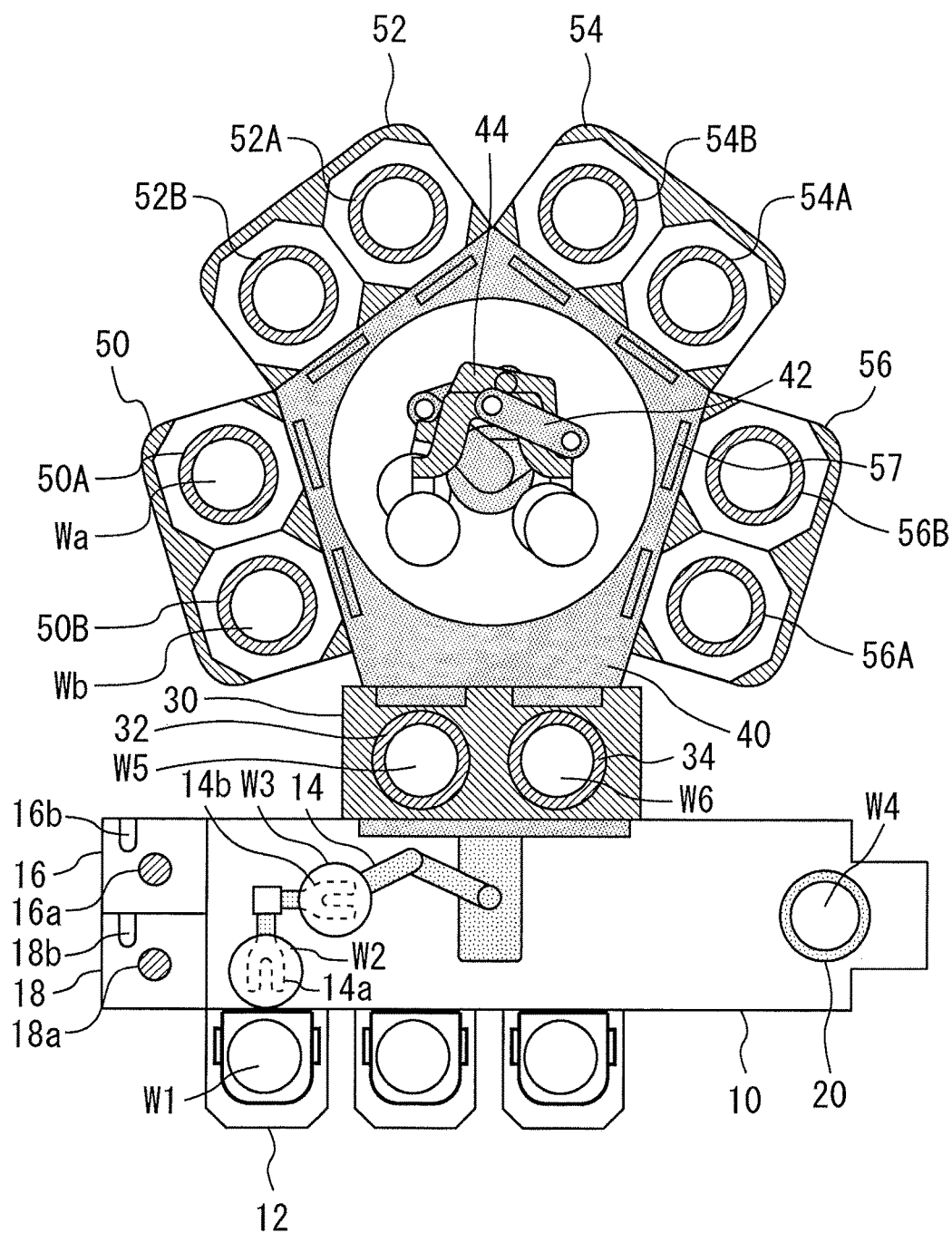
FIG. 1 is a plan view of a wafer processing apparatus according to a first embodiment.

A wafer processing apparatus, a recording medium and a wafer conveying method according to embodiments of the present invention will be described with reference to the accompanying drawings. The same or corresponding components will be assigned the same reference numerals and duplicate description may be omitted.

First Embodiment

FIG. 1 is a plan view of a wafer processing apparatus according to a first embodiment. This wafer processing apparatus is provided with an EFEM (equipment front end module) 10. The EFEM 10 is provided with a load port 12 and a first robot 14. A FOUP is placed on the load port 12. The first robot 14 includes a first end effector 14a and a second end effector 14b. The first end effector 14a and the second end effector 14b are each a vacuum suction apparatus or an electrostatic chuck that suctions one wafer. The first robot 14 is called an "FERB (Front End RoBot)." The first robot 14 is an articulated robot that can move the first end effector 14a and the second end effector 14b separately. The first robot 14 can convey one or two wafers.

Aligners 16 and 18 are attached to the EFEM 10. The aligner 16 is provided with a turntable 16a and a sensor 16b that detects a wafer placed on the turntable 16a. The aligner 18 is provided with a turntable 18a and a sensor 18b that detects a wafer placed on the turntable 18a. The aligners 16 and 18 detect a center of the wafer, a notch or orientation flat of the wafer using a well-known method. Furthermore, the EFEM 10 is provided with a cooling stage 20 used to cool the wafer.

A load lock apparatus 30 is attached to the EFEM 10. The load lock apparatus 30 is a vacuum chamber installed to load or unload a wafer before or after processing. A gate valve is provided between the load lock apparatus 30 and the EFEM 10. The load lock apparatus 30 includes a first LLS (load lock stage) 32 and a second LLS (load lock stage) 34. The load lock apparatus 30 can accommodate a maximum of two wafers. The load lock apparatus 30 is provided within a moving range of the first robot 14.

A WHC (wafer handling chamber) 40 is connected to the load lock apparatus 30. The WHC 40 has a polygonal shape in a plan view, one side face of which is in contact with the load lock apparatus 30. Second robots 42 and 44 are provided in the WHC 40. The second robots 42 and 44 are each called "BERB (Back End RoBot)."

Figure 2:
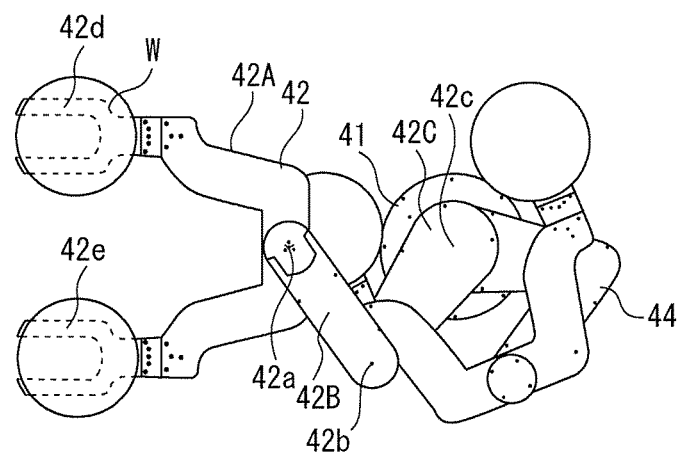
FIG. 2 is a plan view of the second robots.

FIG. 2 is a plan view of the second robots 42 and 44. Since the second robot 42 and the second robot 44 have the same structure, only the second robot 42 will be described. The second robot 42 is a dual arm wafer handling robot that simultaneously conveys two wafers. The second robot 42 is provided with a fork-shaped section 42A, an intermediate section 42B and a bottom section 42C. The fork-shaped section 42A is provided with a first end effector 42d and a second end effector 42e. The first end effector 42d can hold one wafer and the second end effector 42e can hold another wafer. The fork-shaped section 42A and the intermediate section 42B are joined together via a joint 42a. The intermediate section 42B and the bottom section 42C are joined together via a joint 42b. Furthermore, the bottom section 42C and an actuator 41 are joined together via a joint 42c.

Figure 3:
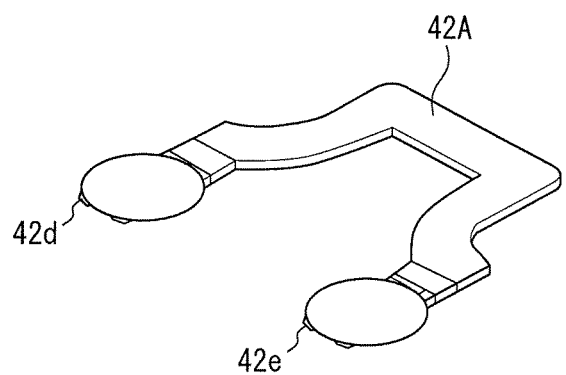
FIG. 3 is a perspective view of the fork-shaped section.

FIG. 3 is a perspective view of the fork-shaped section 42A. The first end effector 42d and the second end effector 42e can each hold one wafer. The first end effector 42d has the same height as the second end effector 42e. Therefore, the height of a wafer held by the first end effector 42d is also the same as the height of another wafer held by the second end effector 42e. The second robots 42 and 44 are not particularly limited to the above-described configuration as long as they can convey wafers simultaneously.

Now, description will be returned to FIG. 1. CMs (chamber modules) 50, 52, 54 and 56 are connected to four side faces of the WHC 40 respectively in a one-to-one correspondence. The WHC 40 is partitioned from the CMs 50, 52, 54 and 56 by gate valves. The CMs 50, 52, 54 and 56 each form a DCM (dual chamber module). The CM 50 includes a first processing stage 50A and a second processing stage 50B. The CM 52 includes a first processing stage 52A and a second processing stage 52B, the CM 54 includes a first processing stage 54A and a second processing stage 54B, and the CM 56 includes a first processing stage 56A and a second processing stage 56B. Thus, the four different CMs each include two processing stages. All the processing stages can be susceptors in which heaters are embedded. A wafer placed on each processing stage is subjected to processing such as film formation or etching. FIG. 1 illustrates a situation in which wafers are placed on all the processing stages.

Figure 4:
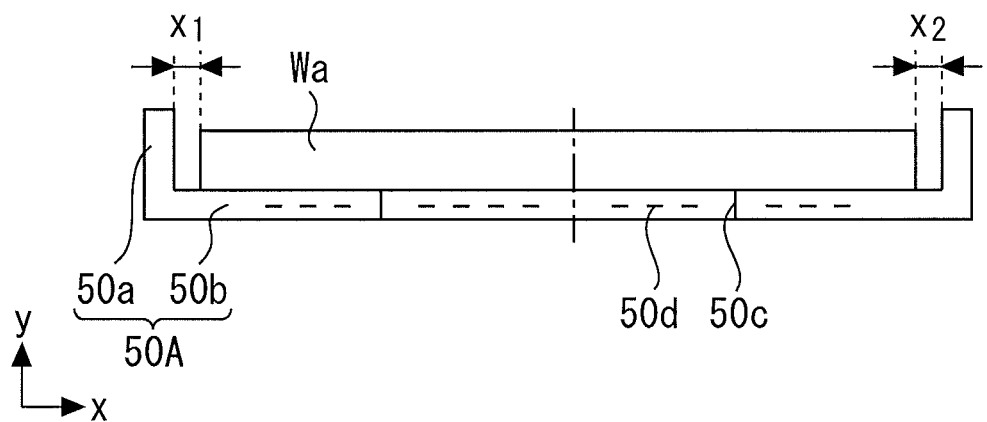
FIG. 4 is a cross-sectional view of the first processing stage.

FIG. 4 is a cross-sectional view of the first processing stage 50A. The first processing stage 50A is provided with a side wall section 50a and a plate section 50b. The side wall section 50a has a ring shape in a plan view and surrounds the plate section 50b. A concave section called "pocket" is provided in the first processing stage 50A by including the side wall section 50a and the plate section 50b. A wafer Wa is accommodated in this concave section. FIG. 4 illustrates that a distance between a left end of the wafer Wa and the side wall section 50a is x1 and a distance between a right end of the wafer Wa and the side wall section 50a is x2. A single-dot dashed line in FIG. 4 indicates a center position of the wafer Wa and a center position of the first processing stage 50A. By causing the center position of the wafer Wa to coincide with the center position of the first processing stage 50A, the distance x1 is allowed to coincide with the distance x2. Causing the center position of the wafer Wa to coincide with the center position of the first processing stage 50A makes uniform the distance from the edge of the wafer Wa to the side wall section 50a. Note that the first processing stages 52A, 54A and 56A and the second processing stages 50B, 52B, 54B and 56B have the same shape as that of the first processing stage 50A.

The diameter of the concave section of the processing stage is a diameter of the inner edge of the side wall section. The diameter of the concave section is often set to be greater than the diameter of the wafer by about 4 mm. Therefore, when the center of the wafer is assumed to coincide with the center of the processing stage, the distance between the wafer edge and the side wall becomes on the order of 2 mm. In contrast, the diameter of the concave section according to the first embodiment of the present invention is preferably a diameter greater than the diameter of the wafer by 1 mm to 2 mm. In this case, when the center of the wafer is assumed to coincide with the center of the processing stage, the distance between the wafer edge and the side wall is 0.5 mm to 1 mm. When the diameter of the wafer is 300 mm, concave sections having a diameter of 301 mm to 302 mm are formed in the first processing stages 50A, 52A, 54A and 56A, and the second processing stages 50B, 52B, 54B and 56B.

Figure 5:
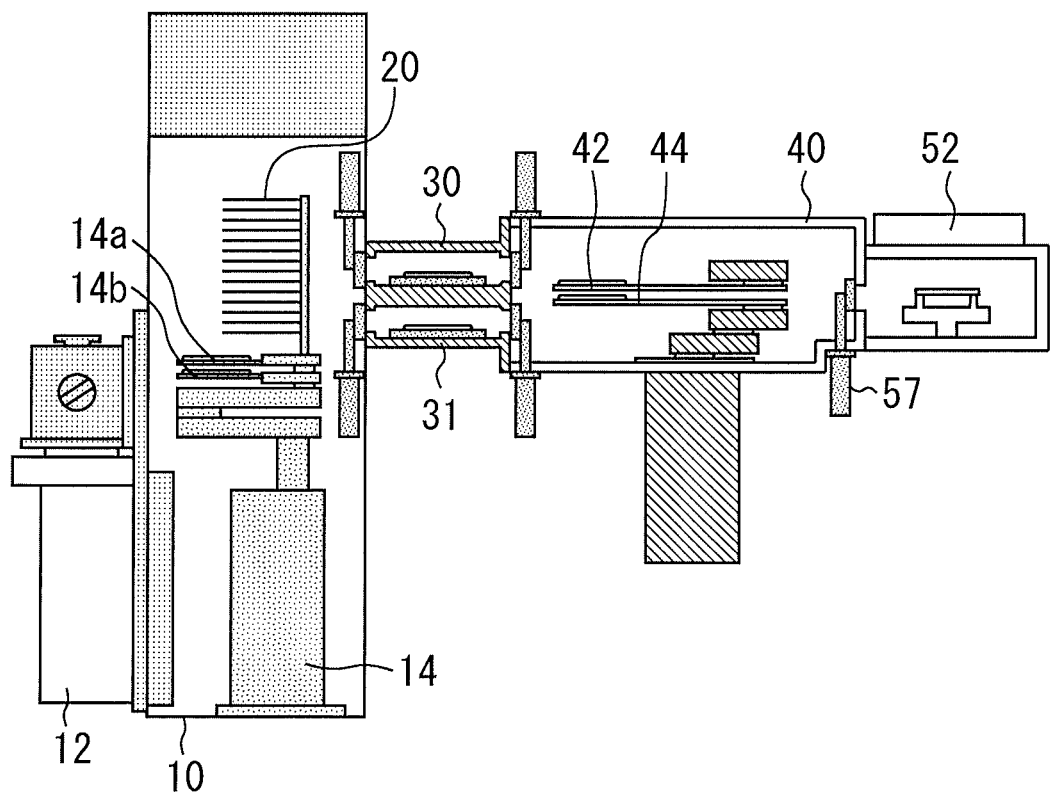
FIG. 5 is a cross-sectional view of the wafer processing apparatus.

FIG. 5 is a cross-sectional view of the wafer processing apparatus according to the first embodiment. A load lock apparatus 31 is provided below the load lock apparatus 30 superimposed thereon. The load lock apparatus 31 has the same configuration as that of the load lock apparatus 30. Therefore, the load lock apparatus 30 has the first LLS 32 and the second LLS 34, and the load lock apparatus 31 also has a first LLS and a second LLS.

The second robots 42 and 44 simultaneously convey two wafers between the first LLS and the second LLS, and the first processing stage and the second processing stage. For example, the second robots 42 and 44 convey the two wafers accommodated in the load lock apparatus 30 to any one of the CMs 50, 52, 54 and 56 and convey the two wafers whose processing in the CM has been completed to the load lock apparatus 31.

Figure 6:
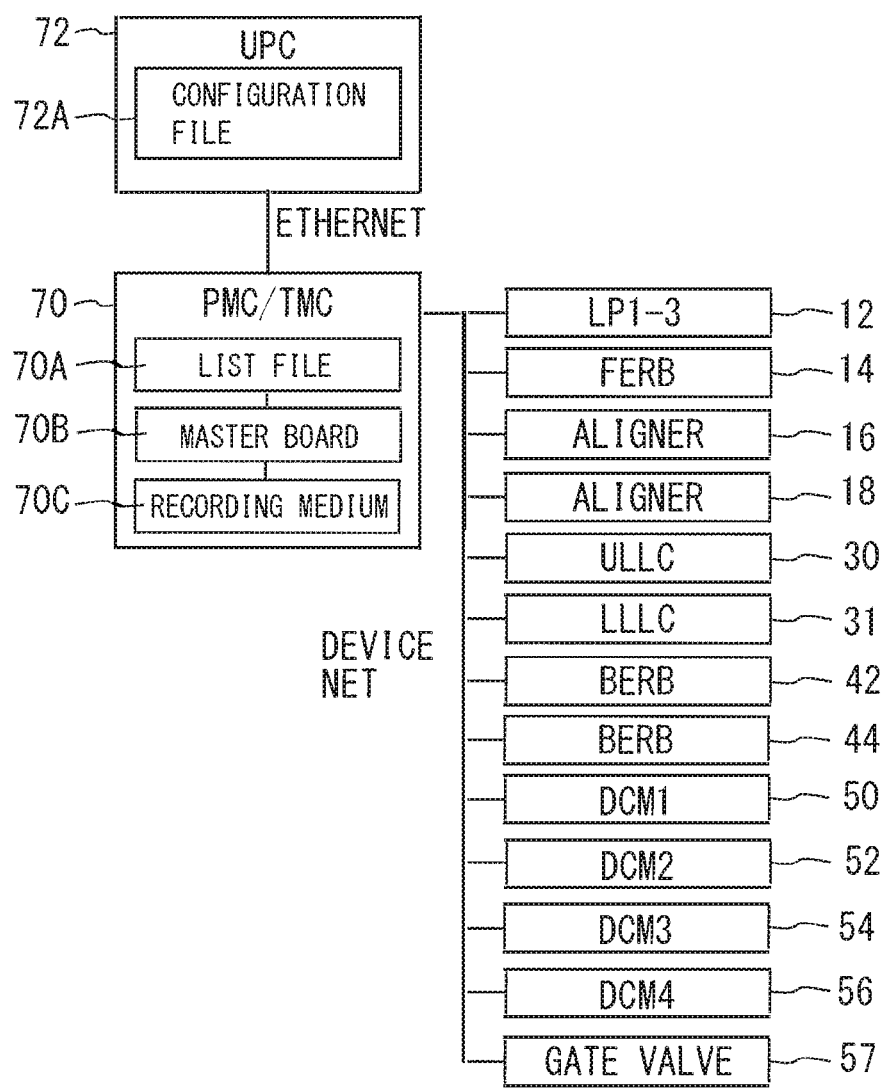
FIG. 6 is a hardware configuration diagram.

FIG. 6 is a hardware configuration diagram of the wafer processing apparatus according to the first embodiment. The aforementioned load ports 12, first robot 14, aligners 16 and 18, load lock apparatuses 30 and 31, second robots 42 and 44, CMs 50, 52, 54 and 56, and gate valves 57 are connected to a controller 70 via a DEVICE NET. Moreover, other devices can be connected to the controller 70. The controller 70 is called a "PMC (process module controller)" or "TMC (transfer module controller)." The controller 70 is provided with a list file 70A, a computer 70B and a recording medium 70C.

A main control apparatus 72 is connected to the controller 70. The main control apparatus 72 is provided with a configuration file 72A. The configuration file 72A records ID information, communication data size information and type information on respective devices such as the second robots 42 and 44 connected to the controller 70. The ID information refers to a "MAC address" assigned to each device. The communication data size information refers to information on a data size during input or output of a certain device. The type information refers to information that identifies the type of the device.

The list file 70A is obtained by converting the configuration file 72A to a controller 70 (computer) readable format. The computer 70B of the controller 70 controls devices described in the list file 70A based on a command from the main control apparatus 72. The "devices" refer to all the devices connected to the Device Net. The controller 70 is provided with the recording medium 70C. The recording medium 70C records a computer-readable program. The main control apparatus 72 determines wafer processing order and a recipe for processing each wafer using its scheduler function. The controller 70 causes the devices described in the list file 70A to process a substrate according to processing order and a recipe of a substrate determined in the main control apparatus 72.

Figure 7:
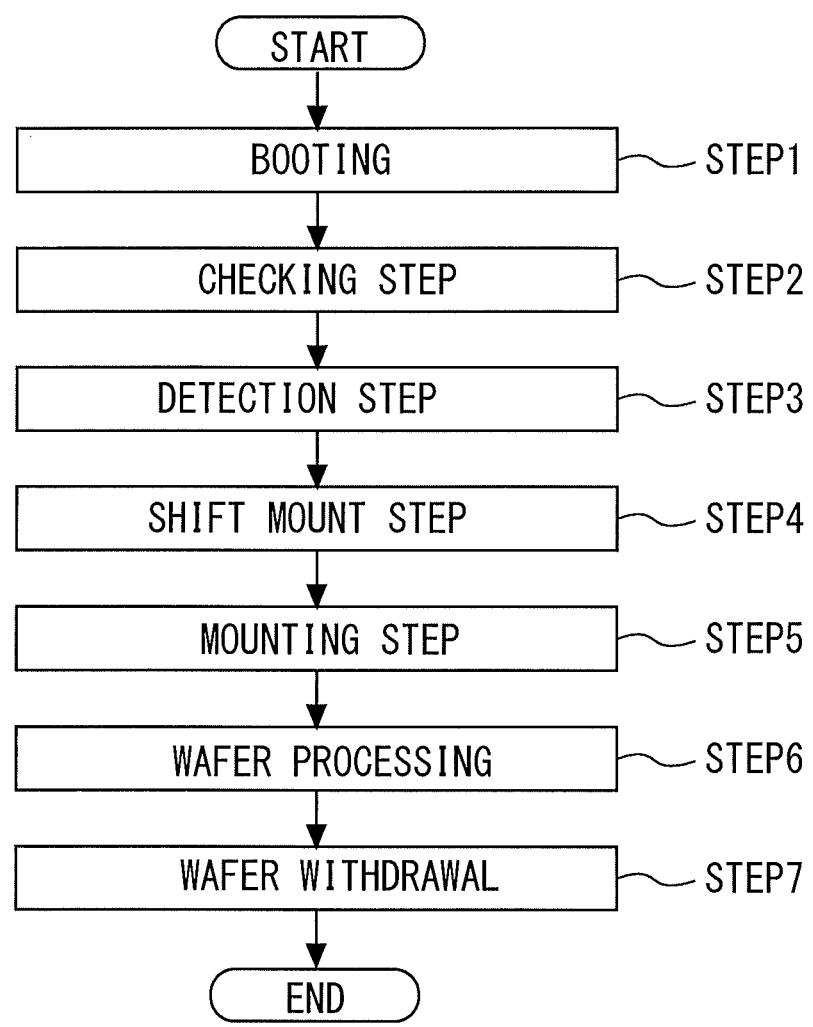
FIG. 7 is a flowchart illustrating a wafer conveying method.

FIG. 7 is a flowchart illustrating a wafer conveying method using the wafer processing apparatus according to the first embodiment. First, in Step 1, the wafer processing apparatus is started. "Starting" means turning on power to the wafer processing apparatus shut down for reasons such as periodical maintenance or malfunction.

Next, the process is advanced to step 2. In step 2, checking is made on a first position shift amount which is a position shift of the first processing stages 50A, 52A, 54A and 56A with respect to the load lock apparatuses 30 and 31, and a second position shift amount which is a position shift of the second processing stages 50B, 52B, 54B and 56B with respect to the load lock apparatuses 30 and 31. This step is called a "checking step." When the wafer processing apparatus is manufactured in completely the same size as designed, the first position shift amount and the second position shift amount are both 0. However, slight dimensional errors are actually produced in parts of the wafer processing apparatus, and the dimensional errors make the first position shift amount and the second position shift amount significant values. For example, when the distance between the two processing stages in the CM is shifted from the design value, the first position shift amount and the second position shift amount become significant values.

For example, in an orthogonal coordinate system, the first position shift amount and the second position shift amount are clarified by calculating the position shift amounts of the first processing stages 50A, 52A, 54A and 56A, and the second processing stages 50B, 52B, 54B and 56B with respect to reference positions of the load lock apparatuses 30 and 31. The reference positions of the load lock apparatuses 30 and 31 are any given locations of the load lock apparatuses 30 and 31. For example, it is possible to designate the center of the first LLS 32 as a reference position or designate the center of the second LLS 34 as a reference position or designate an intermediate position between the center of the first LLS 32 and the center of the second LLS 34 as a reference position. Note that it may be possible to adopt not only an orthogonal coordinate system but also a polar coordinate system.

One example of specific means for checking the first position shift amount and the second position shift amount is as follows. First, the wafer processing apparatus is heated up to the same temperature as that when a wafer is processed. For example, all the heaters of the eight processing stages are heated to heat the processing stages up to on the order of 350° C. With the wafer processing apparatus heated, a dedicated wafer having a diameter that matches that of the pocket of the processing stage is entered in the pocket. That is, eight dedicated wafers are provided to the first processing stages 50A, 52A, 54A and 56A and the second processing stages 50B, 52B, 54B and 56B. Then, the edges of the dedicated wafers come into contact with the side walls of the processing stages or are deemed as being in contact therewith. In this condition, the center of each dedicated wafer coincides with the center of each processing stage.

Such dedicated wafers are moved to the load lock apparatus 30 or the load lock apparatus 31 using the second robot 42 or the second robot 44. As a specific example, the first processing stage 50A and the second processing stage 50B descend with respect to a lift pin 50c, and the lift pin 50c thereby protrudes and supports the wafer. In this condition, the first end effector 42*d* of the second robot 42 suctions the rear side of one wafer Wa and the second end effector 42*e* suctions the rear side of the other wafer Wb. The second robot 42 is then moved and the two wafers Wa and Wb are placed on the first LLS and the second LLS of the load lock apparatus 31.

After that, the two wafers Wa and Wb of the load lock apparatus 31 are moved by the first robot 14 to the aligner 16. By using the aligner 16 to detect a shift between the center of the turntable 16*a* and the center of the dedicated wafer, it is possible to detect the amount of shift between the center of the pocket of the first processing stage 50A and the second processing stage 50B and the designed center of the pocket. The first position shift amount of the first processing stages 52A, 54A and 56A, and the second position shift amount of the second processing stages 52B, 54B and 56B are clarified using a procedure similar to this. The four first position shift amounts and the four second position shift amounts are thereby calculated.

By the checking step in step 2, the following data can be obtained, for example. The unit is mm.

Position shift amount of center coordinates of first processing stage 50A with respect to reference position: (0.1, −0.2)
Position shift amount of center coordinates of first processing stage 52A with respect to reference position: (0.1, 0)
Position shift amount of center coordinates of first processing stage 54A with respect to reference position: (0.3, 0.3)
Position shift amount of center coordinates of first processing stage 56A with respect to reference position: (−0.3, −0.5)
Position shift amount of center coordinates of second processing stage 50B with respect to reference position: (0.2, −0.1)
Position shift amount of center coordinates of second processing stage 52B with respect to reference position: (0, −0.1)
Position shift amount of center coordinates of second processing stage 54B with respect to reference position: (0.2, 0.2)
Position shift amount of center coordinates of second processing stage 56B with respect to reference position: (−0.1, −0.3)

The size of the wafer processing apparatus slightly changes depending on a temperature. For example, when the wafer processing apparatus formed of Al is heated to several hundreds of degrees, the size of the apparatus increases by approximately 0.1 mm compared to that during normal temperature. Thus, by detecting the first and second position shift amounts when the wafer processing apparatus is heated, it is possible to know the first and second position shift amounts in the same temperature environment as that during wafer processing.

Next, the process is advanced to step 3. The process from step 3 relates to a process on a product wafer. In step 3, the controller 70 first refers to a wafer processing schedule, identifies a wafer to be conveyed to the processing stage and detects, for example, that the wafer should be moved to, for example, the first processing stage 50A. The controller 70 controls the first robot 14, and the identified wafer is moved from the load port 12 to the aligner 16 or aligner 18. The aligner 16 or the aligner 18 detects a center and a notch or an orientation flat of the wafer. As a specific example, the turntable 16*a* is turned, and while the wafer is being turned, the sensor 16*b* detects the wafer to detect a center and a notch or an orientation flat of the wafer. Of course, the aligner 18 may also be used. This step is called a "detection step."

Next, the process is advanced to step 4. In step 4, the first robot 14 conveys the wafer located at the aligner 16 to the first LLS 32 or the second LLS 34. For example, suppose a case where the wafer is placed on the first LLS 32. In that case, the first robot 14 places the wafer on the first LLS 32 in such a way that the center of the wafer detected in the center detection step is shifted from the center of the first LLS 32 by the first position shift amount relating to the first processing stage 50A. More specifically, the wafer is placed on the first LLS 32 so that the center of the wafer is shifted from the center of the first LLS 32 by (0.1, −0.2).

Using the same procedure as that for placing the wafer on the first LLS 32, one wafer is placed on the second LLS 34 as well. More specifically, the controller 70 refers to the wafer processing schedule, identifies a wafer to be conveyed to the processing stage and detects that the wafer is moved to, for example, the second processing stage 50B. The identified wafer is moved by the first robot 14 from the load port 12 to the aligner 16 or 18. After the aligner 16 or 18 detects the center and notch or orientation flat of the wafer, the wafer is placed by the first robot 14 on the second LLS 34. In that case, the first robot 14 places the wafer on the second LLS 34 so that the center of the wafer detected in the center detection step is shifted from the center of the second LLS 34 by the second position shift amount relating to the second processing stage 50B. More specifically, the first robot 14 places the wafer on the second LLS 34 so that the center of the wafer is shifted from the center of the second LLS 34 by (0.2, −0.1).

Thus, based on destination information whereby it is possible to know for which processing stage the wafer is headed, the wafer is placed by being shifted from the center of the LLS by the position shift amount relating to the destination processing stage. Thus, the step of conveying the wafer to the first or second load lock stage, with the center of the wafer shifted from the center of the first or second LLS is called a "shift mounting step."

Next, the process is advanced to step 5. In step 5, the second robot 42 or 44 is used to pick up the wafer on the first LLS 32 and the wafer on the second LLS 34, the wafer on the first LLS 32 is placed on the first processing stage 50A, and at the same time, the wafer on the second LLS 34 is placed on the second processing stage 50B. The second robot conveys the two wafers based on design coordinates of the load lock apparatus 30, the first processing stage 50A and the second processing stage 50B regardless of the first position shift amount and the second position shift amount. For this reason, conveyance by the second robot is extremely simple, that is, moving the wafer of the load lock apparatus 30 to the CM 50 as designed.

In the shift mounting step, the wafer is conveyed by shifting the center of the wafer from the center of the first LLS 32 by the first position shift amount relating to the first processing stage 50A and shifting the center of the wafer from the center of the second LLS 34 by the second position shift amount relating to the second processing stage 50B. Thus, it is possible to make the center of the wafer placed on the first processing stage 50A coincide with the center of the first processing stage 50A and make the center of the wafer placed on the second processing stage 50B coincide with the center of the second processing stage 50B by only conveying the two wafers to the CM 50 using the second robot. It is thereby possible to make uniform the distance between the edge of the wafer and the side wall of the processing stage.

Thus, the step of picking up the wafer on the first LLS 32 and the wafer on the second LLS 34, and simultaneously placing the one wafer on the first processing stage 50A and the other wafer on the second processing stage 50B is called a "mounting step. Note that "coincidence" between the center of the wafer and the center of the processing stage includes not only "coincidence" in the strict sense of the word but also cases that can be substantially considered as "coincidence" from the standpoint of wafer processing.

Figure 8:
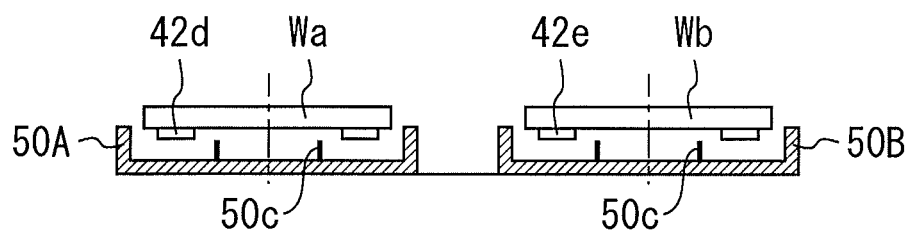
FIG. 8 is a diagram illustrating the first and second end effectors.
Figure 9:
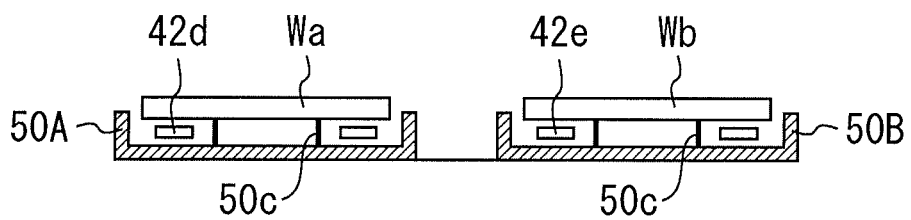
FIG. 9 is a diagram illustrating the first and second end effectors.
Figure 10:
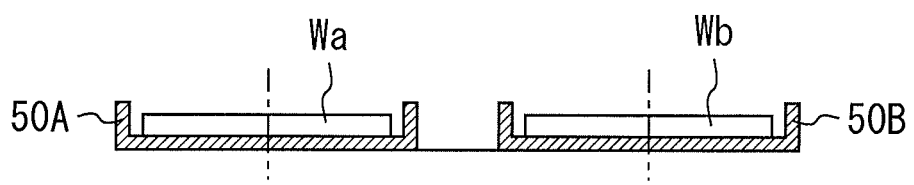
FIG. 10 is a diagram illustrating the wafers.

FIGS. 8 to 10 are diagrams illustrating motion of the second robot 42 in the mounting step. All FIGS. 8 to 10 illustrate cross sections of the interior of the CM 50 in the mounting step. FIG. 8 is a diagram illustrating that the first end effector 42d holding the wafer Wa is placed on the first processing stage 50A and the second end effector 42e holding the wafer Wb is placed on the second processing stage 50B. The lift pin 50c extends vertically from the first processing stage 50A and the lift pin 50c extends vertically from the second processing stage 50B. The first processing stage 50A and the second processing stage 50B are each provided with three lift pins 50c, for example.

Next, by causing the second robot 42 to descend, the first end effector 42d and the second end effector 42e are thereby caused to descend. FIG. 9 is a diagram illustrating that the first end effector 42d and the second end effector 42e are caused to descend and the wafers Wa and Wb are held by the lift pins 50c. When the wafers Wa and Wb are held by the lift pins 50c, the first end effector 42d separates from the wafer Wa and the second end effector 42e separates from the wafer Wb.

Next, the first end effector 42d and the second end effector 42e are pulled out from the CM 50 and the lift pins 50c are caused to descend. Then, as shown in FIG. 10, the wafer Wa is placed in a pocket of the first processing stage 50A and the wafer Wb is placed in a pocket of the second processing stage 50B. Since the two wafers are simultaneously placed on the processing stages in the mounting step in this way, the mounting step can be finished rapidly. Moreover, as described above, since the wafers are placed on the first LLS 32 and the second LLS 34 by shifting the wafers from their respective positions, it is possible to make the center of the wafer Wa coincide with the center of the first processing stage 50A, and make the center of the wafer Wb coincide with the center of the second processing stage 50B.

Next, the process is advanced to step 6. In step 6, for example, film formation processing is applied to the two wafers in the CM 50. Since the center of the wafers has been made to coincide with the center of the processing stage in the mounting step, the distance between the edge of the wafers and the side wall of the processing stage is uniform. Therefore, it is possible to improve uniformity of film formation with respect to the wafers.

Next, the process is advanced to step 7. In step 7, the second robot 42 or the second robot 44 moves the two wafers in the CM 50 to the load lock apparatus 31. Furthermore, the first robot 14 returns the two wafers of the load lock apparatus 31 to the FOUP of the load port 12.

Figure 11:
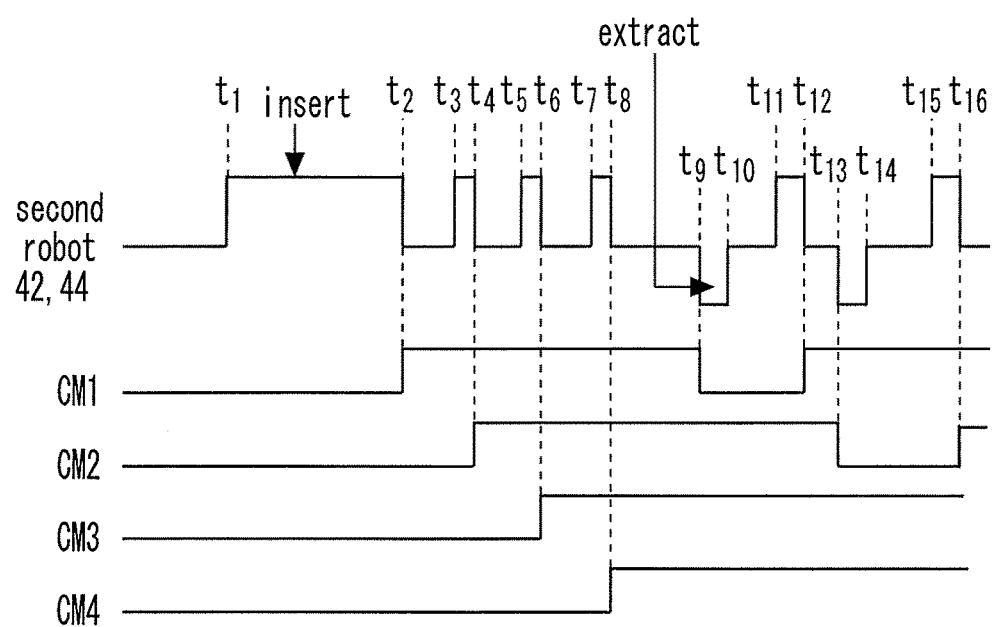
FIG. 11 is a timing chart of operation of each device.

The series of steps described in steps 1 to 7 are sequentially executed on the CMs 50, 52, 54 and 56. FIG. 11 is a timing chart of operation of each device. When the waveform of the second robot 42 or 44 is high, the second robot 42 or 44 loads the wafer onto any one of the CMs 50, 52, 54 and 56, whereas when the waveform of the second robot 42 or 44 is low, the second robot 42 or 44 unloads the wafer from any one of the CMs 50, 52, 54 and 56. When the waveform of the CM 50, 52, 54 or 56 is high, processing on the wafer is performed in the CM.

For a period of time t1 to t2, the second robot 42 simultaneously conveys two wafers to the CM 50. Wafer processing in the CM 50 starts at time t2 at which the conveyance ends. For a period of time t3 to t4, the second robot 42 simultaneously conveys two wafers to the CM 52 and for a period of time t5 to t6, the second robot 42 simultaneously conveys two wafers to the CM 54, and for a period of time t7 to t8, the second robot 42 simultaneously conveys the two wafers to the CM 56.

In the shift mounting step, the wafer to be conveyed to the first processing stage 52A is placed on the first LLS 32 so that the center of the wafer is shifted from the center of the first LLS 32 by (0.1, 0) and the wafer to be conveyed to the second processing stage 52B is placed on the second LLS 34 so that the center of the wafer is shifted from the center of the second LLS 34 by (0, −0.1). Therefore, for the period of time t3 to t4, by simply only conveying the two wafers to the CM 52 without centering the wafers, the second robot 42 can cause the center of each wafer to coincide with the center of the processing stage.

In the shift mounting step, the wafer to be conveyed to the first processing stage 54A is placed on the first LLS 32 so that the center of the wafer is shifted from the center of the first LLS 32 by (0.3, 0.3) and the wafer to be conveyed to the second processing stage 54B is placed on the second LLS 34 so that the center of the wafer is shifted from the center of the second LLS 34 by (0.2, 0.2). Therefore, for the period of time t5 to t6, by simply only conveying the two wafers to the CM 54 without centering the wafers, the second robot 42 can cause the center of each wafer to coincide with the center of the processing stage.

In the shift mounting step, the wafer to be conveyed to the first processing stage 56A is placed on the first LLS 32 so that the center of the wafer is shifted from the center of the first LLS 32 by (−0.3, −0.5) and the wafer to be conveyed to the second processing stage 56B is placed on the second LLS 34 so that the center of the wafer is shifted from the center of the second LLS 34 by (−0.1, −0.3). Therefore, for the period of time t7 to t8, by simply only conveying the two wafers to the CM 56 without centering the wafers, the second robot 42 can cause the center of each wafer to coincide with the center of the processing stage.

The process up to time t8 is completed during processing on the wafer by the CM 50. The CMs 52, 54 and 56 start processing as soon as the wafer is conveyed. It is preferable to continue to convey the wafer using the second robots 42 and 44 together. In this way, it is possible to increase throughput by loading or unloading the wafer for another CM while performing processing in one CM.

When wafer processing in the CM 50 ends at time t9, the second robot 42 moves the two wafers in the CM 50 to the load lock apparatus 31 for a period of time t9 to t10. After that, for a period of time t11 to t12, by going through the shift mounting step, the two wafers placed on the load lock apparatus 30 are simultaneously conveyed by the second robot to the CM 50. Since time t9 to t12 is a period during which the process in the CM 50 is stopped, shortening this period contributes to an improvement of throughput. In the first embodiment of the present invention, as described above, the second robot only conveys the two wafers of the load lock apparatus 30 to the CM simultaneously, and the second robot does not perform centering of the wafers. Since the motion of the second robot is simple, it is possible to shorten the time required by time t9 to t12.

At time t13, the process on the wafers in the CM 52 ends. For a period of time t13 to t14, the second robot conveys the two wafers of the CM 52 to the load lock apparatus 31. After that, for a period of time t15 to t16, by going through the shift mounting step, the two wafers placed on the load lock apparatus 30 are simultaneously conveyed by the second robot to the CM 52. The second robot only simultaneously conveys the two wafers of the load lock apparatus 30 to the CM 52, and the second robot performs no centering of the wafers. Thus, the motion of the second robot is simple and it is thereby possible to shorten the time required by time t13 to t16. Hereinafter, wafers are loaded or unloaded on/from the CMs in the like manner.

Here, for a period of time t9 to t12, while the second robot 42 is unloading the two wafers from the CM 50, the second robot 44 conveys the two unprocessed wafers to the CM 50, and can thereby further shorten the period of time t9 to t12.

In this series of processes, it is important for the controller 70 to control the first robot 14 so that the wafer is placed on the first LLS in such a way that the center of the wafer is shifted from the center of the first LLS by a first position shift amount and the wafer is placed on the second LLS in such a way that the center of the wafer is shifted from the center of the second LLS by a second position shift amount. Such a series of wafer conveying sequences are executed by recording a program in the computer-readable recording medium 70C, causing the computer 70B to read and execute the program. The program is one that causes the computer to execute a checking step of checking a first position shift amount and a second position shift amount, a wafer center detection step of detecting the center of a wafer, a shift mounting step and a mounting step.

Examples of the recording medium 70C include non-volatile or volatile semiconductor memory such as RAM, ROM, flash memory, EPROM, EEPROM, or magnetic disk, flexible disk, optical disk, compact disk, mini-disk or DVD. The recording medium 70C is preferably a non-transient recording medium.

An important feature of the wafer processing apparatus according to the first embodiment is that the position at which the wafer is mounted on the LLS is shifted by an amount corresponding to a positional shift by which the processing stage is shifted from the design, and it is thereby possible to cause the center of the processing stage to coincide with the center of the wafer without performing alignment using the second robot. Various modifications can be made on the aforementioned configuration and processing sequences as long as this feature is not lost. For example, the configuration and the operation scheme of the first robot 14 and the second robots 42 and 44 can be changed. The second robots 42 and 44 are not particularly limited as long as they can simultaneously convey a plurality of wafers. For example, one second robot may convey three wafers simultaneously. In that case, three processing stages are provided for one CM. In the first embodiment of the present invention, eight reactors are provided, but the number of reactors may be changed as required. The number of aligners may be one or three or more. The CMs 50, 52, 54 and 56 are not limited to DCMs. For example, the CMs 50, 52, 54 and 56 may be QCMs. In that case, four position shift amounts need to be checked for one CM.

The second robots 42 and 44 perform reciprocating motion between the load lock apparatus 30 or load lock apparatus 31 and one CM. In addition to such reciprocating motion, operation of conveying a wafer from one CM to another CM may also be added. In this case, when moving two wafers from one CM to another CM, centering needs to be performed one by one.

Processing performed by the CMs 50, 52, 54 and 56 is not particularly limited. The CMs 50, 52, 54 and 56 can perform plasma CVD, thermal CVD, plasma ALD, thermal ALD, etching or UV cure. The CMs 50, 52, 54 and 56 may be etchers. When a CM is used as an etcher, the diameter of the processing stage may be made smaller than the diameter of the wafer so as to cover the processing stage with the wafer. This makes it possible to prevent plasma from directly striking the processing stage. In this case, a notch is provided at a part of the processing stage where a notch or orientation flat is expected to be provided so that the processing stage is not exposed by the notch or orientation flat. In the center detection step, a notch or orientation flat of the wafer is detected, and in the shift mounting step, the wafer is placed on the first LLS and the second LLS so that the notch or orientation flat is oriented toward a predetermined direction. This makes it possible to cause the position of the notch of the processing stage to coincide with the position of the notch or orientation flat.

These modifications are applicable to wafer processing apparatuses, recording media or wafer conveying methods according to the following embodiments. Note that the wafer processing apparatuses, recording media or wafer conveying methods according to the following embodiments have many points common to those of the first embodiment, and therefore description will focus on differences from the first embodiment.

Second Embodiment

Figure 12:
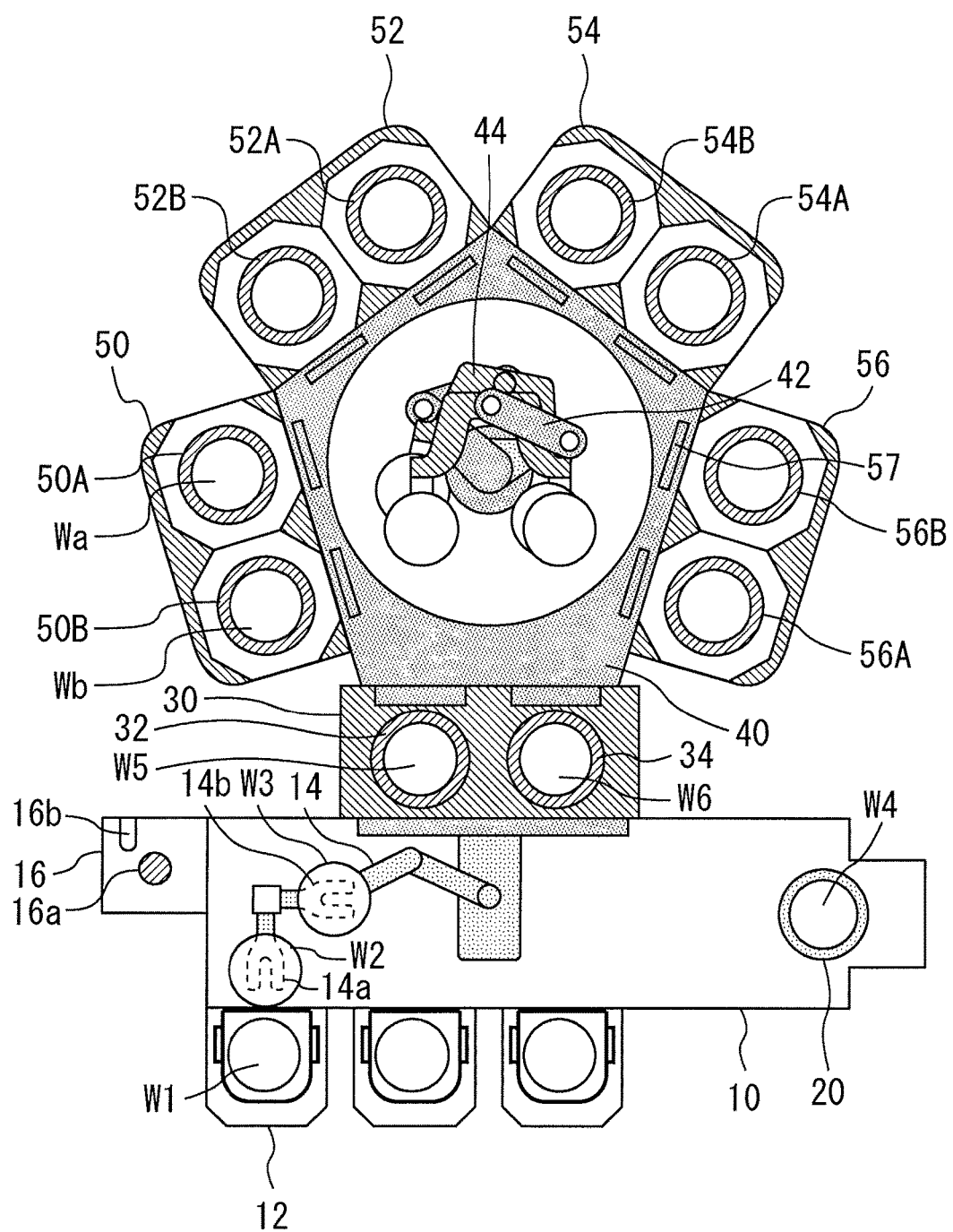
FIG. 12 is a diagram illustrating a wafer processing apparatus according to a second embodiment.

FIG. 12 is a diagram illustrating a wafer processing apparatus according to a second embodiment. This wafer processing apparatus corresponds to the wafer processing apparatus in FIG. 1 except in that the aligner 18 is removed. It goes without saying that processing is done faster using two aligners together than when processing is done using one aligner. However, when processing such as film formation in the CMs 50, 52, 54 and 56 takes a long time, even when operation of the first robot 14 of placing a wafer on a load lock apparatus or unloading a wafer from the load lock apparatus takes a long time, there is no influence on the entire throughput. Furthermore, it is not necessary to speed up the processing by the aligner either. In this case, the configuration can be simplified by using only one aligner.

Third Embodiment

Figure 13:
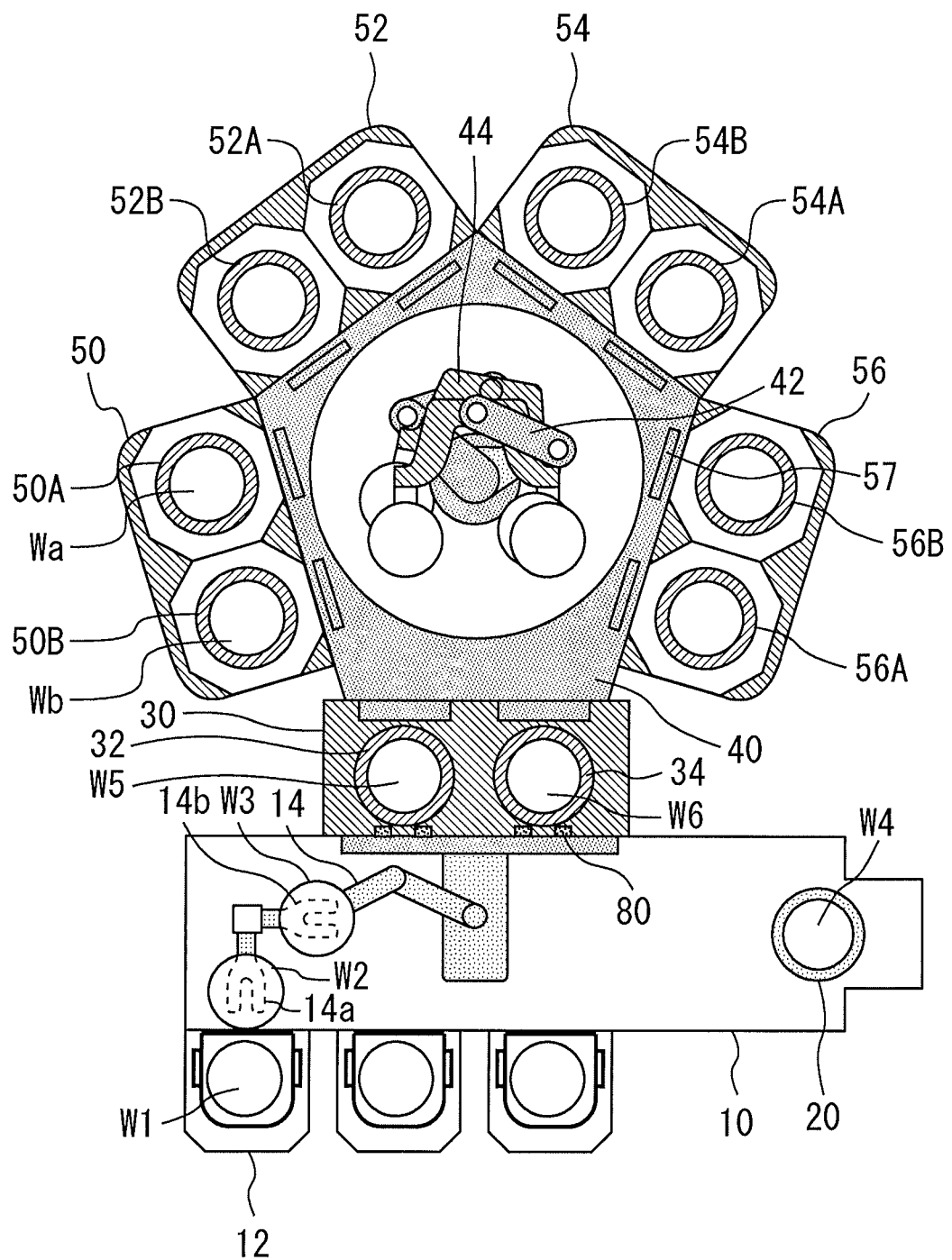
FIG. 13 is a diagram illustrating a wafer processing apparatus according to a third embodiment.

FIG. 13 is a diagram illustrating a wafer processing apparatus according to a third embodiment. A sensor 80 is attached to the load lock apparatus 30. Two sensors 80 are provided along a gate valve between the EFEM 10 and the first LLS 32, and two sensors 80 are provided along a gate valve between the EFEM 10 and the second LLS 34. The sensors 80 are provided in a path along which the first robot 14 loads a wafer from the EFEM 10 onto the load lock apparatus 30.

Figure 14:
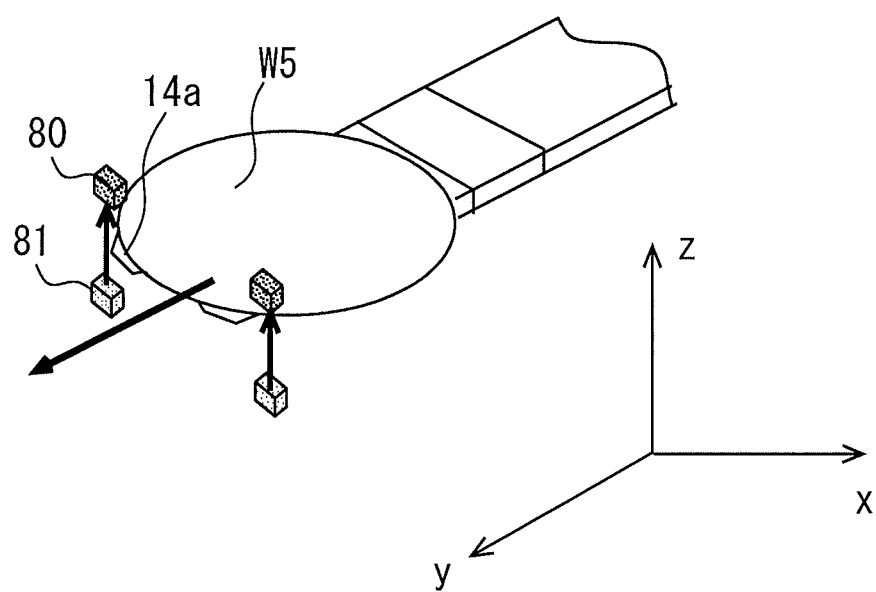

FIG. 14 is a diagram illustrating the sensor 80 or the like. A semiconductor laser element 81 is located below the sensor 80. The semiconductor laser element 81 emits laser light in a positive z-direction and the sensor 80 receives the laser light. When the first end effector 14a is moved in a positive y-direction to convey the wafer W5 to the load lock apparatus 30, the wafer W5 blocks the laser light emitted from the semiconductor laser element 81. The fact that the laser light is blocked by the wafer is detected by the absence of light input to the sensor 80. The center position of the wafer W5 can be recognized from timing at which the laser light is blocked by the wafer. The controller 70 functions as a center calculation section that calculates the center of the wafer from information of the sensor 80.

Figure 15:
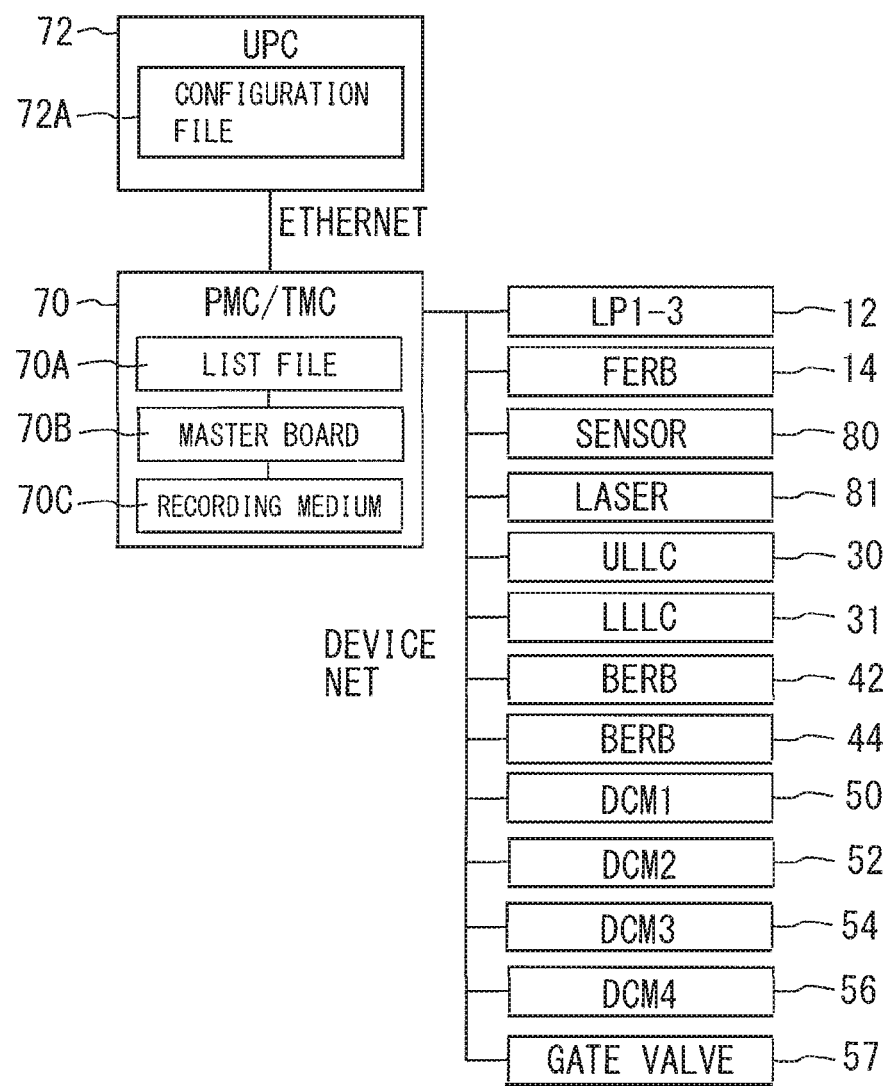
FIG. 15 is a hardware configuration diagram of the wafer processing apparatus according to the third embodiment.

In this way, it is possible to calculate the center of the wafer loaded onto the load lock apparatus from the EFEM 10. FIG. 15 is a hardware configuration diagram of the wafer processing apparatus according to the third embodiment. The sensor 80 and the semiconductor laser element 81 are controlled by the controller 70. The controller 70 detects information of the two sensors 80 located in the path of one wafer. The controller 70 calculates the center of the wafer from timing at which light input to the sensor 80 falls below a predetermined value. The process after calculating the center of the wafer is as described in the first embodiment. The controller 70 causes the first robot 14 to convey the wafer using the information of the center position of the wafer obtained using the sensor 80.

In the first and second embodiments, the controller 70 causes the first robot 14 to convey the wafer using the center of the wafer detected by the aligner. However, in the third embodiment, the center of the wafer is detected using the sensor 80 instead of the aligner. Calculating the center of the wafer using the sensor 80 can speed up the processing compared to calculating the center of the wafer using the aligner.

When there is no aligner, it is not possible to detect a notch or orientation flat of the wafer. However, when the CM is used as a film formation apparatus, even when the position of a notch or orientation flat is shifted from a predetermined place of the processing stage, there is substantially no influence on processing quality. Therefore, when the CM is used as the film formation apparatus, it is possible to expect an improvement of throughput by using the sensor 80 while omitting the aligner.

Fourth Embodiment

Figure 16:
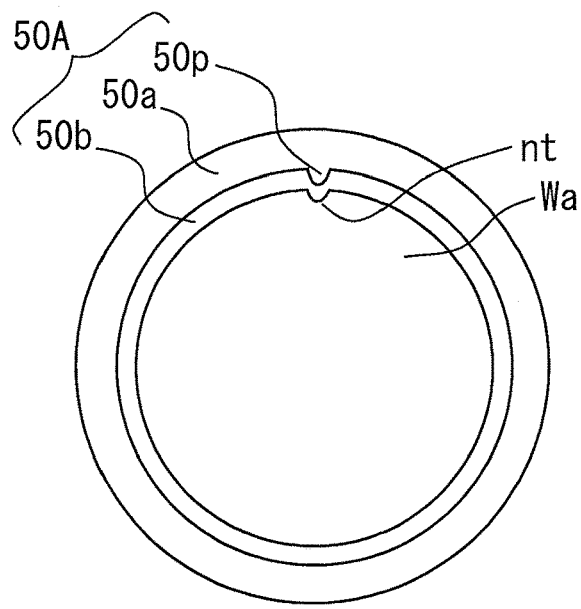
FIG. 16 is a plan view of a first processing stage according to a fourth embodiment.

FIG. 16 is a plan view of a first processing stage 50A according to a fourth embodiment. The first processing stage 50A is provided with a plate section 50b and a side wall section 50a that is connected to the plate section 50b and surrounds a space above the plate section 50b. Thus, a concave section for accommodating a wafer is formed in the first processing stage 50A. A convex section 50p is formed in an inner wall of this concave section. The convex section 50p protrudes at a center of the first processing stage 50A in a plan view. All the processing stages preferably have the same shape as the first processing stage 50A.

The controller 70 controls the second robots 42 and 44, and causes a notch of a wafer to face the convex section 50p when placing the wafer on the first processing stage 50A. More specifically, the controller 70 first detects the notch position of the wafer in a center detection step. The notch position of the wafer can be detected by an aligner. After that, in a mounting step, the controller 70 causes the notch of the wafer detected in the center detection step to face the convex section 50p. FIG. 16 shows that a notch nt of the wafer Wa faces the convex section 50p.

When the first processing stage 50A is heated to heat and process the wafer, the wafer is preferably heated uniformly. However, the distance from the ring-shaped side wall section 50a to the notch nt is greater than the distance from the side wall section 50a to the non-notch part of the wafer. For this reason, the temperature at the notch nt part may be lower than that at the non-notch part.

Thus, in the fourth embodiment of the present invention, the convex section 50p is provided in the first processing stage 50A and the convex section 50p is caused to face the notch nt. This makes it possible to cause the distance from the convex section 50p to the notch nt to substantially coincide with the distance from the side wall section 50a to the non-notch part of the wafer. In the aforementioned shift mounting step and mounting step, the center of the wafer is caused to coincide with the center of the processing stage, and it is thereby possible to make the temperature of the wafer substantially uniform, and uniformity in the temperature of the wafer can be increased further by causing the convex section 50p to face the notch nt. When wafers are mounted on all the processing stages, it is preferable to cause the convex section to face the notch.

Figure 17:
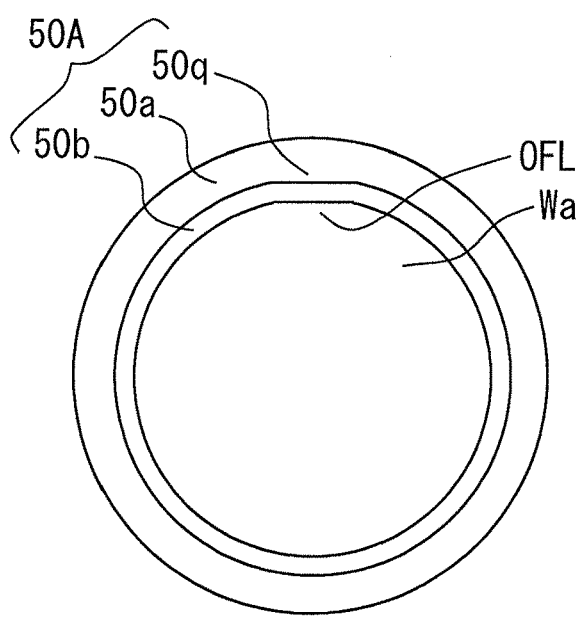
FIG. 17 is a plan view of a first processing stage according to a modification.

FIG. 17 is a plan view of a first processing stage 50A according to a modification. A convex section 50q is a part protruding at a center of the first processing stage 50A more than a ring-shaped side wall section 50a. The convex section 50q provides a flat inner wall. A wafer Wa having an orientation flat OFL is placed on the first processing stage 50A. When placing the wafer Wa on the first processing stage 50A, the controller 70 controls the second robots 42 and 44 to cause the orientation flat OFL of the wafer to face the convex section 50q. More specifically, the controller 70 first detects the orientation flat position of the wafer in a center detection step. The orientation flat position of the wafer can be detected by the aligner. After that, in a mounting step, the orientation flat of the wafer detected in the center detection step is caused to face the convex section 50q. FIG. 17 illustrates that the orientation flat OFL of the wafer Wa faces the convex section 50q.

It is possible to combine the features of the wafer processing apparatus, the recording medium and the wafer conveying method described so far in the embodiments to enhance the effects of the present invention.

Obviously many modifications and variations of the present invention are possible in the light of the above teachings. It is therefore to be understood that within the scope of the appended claims the invention may be practiced otherwise than as specifically described.

What is claimed is:

1. A wafer processing apparatus comprising:
a first robot that conveys a wafer;
a load lock apparatus that comprises a first load lock stage and a second load lock stage and is provided within a moving range of the first robot;
a chamber module that comprises a first processing stage and a second processing stage;
a second robot that simultaneously conveys two wafers from the first load lock stage and the second load lock stage to the first processing stage and the second processing stage; and
a controller that controls the first robot to place the wafer on the first load lock stage so that a center of the wafer is shifted from a center of the first load lock stage by a first position shift amount, which is a position shift corresponding to the load lock apparatus of the first processing stage, and place another wafer on the second load lock stage so that a center of the wafer is shifted from a center of the second load lock stage by a second position shift amount, which is a position shift corresponding to the load lock apparatus of the second processing stage.

2. The wafer processing apparatus according to claim 1, further comprising an aligner that detects the center of the wafer,
wherein the controller causes the first robot to convey the wafer using the center of the wafer detected by the aligner.

3. The wafer processing apparatus according to claim 2, comprising the aligner in plurality.

4. The wafer processing apparatus according to claim 2, wherein the chamber module is an etcher.

5. The wafer processing apparatus according to claim 1, further comprising:
 a sensor attached to the load lock apparatus to detect a wafer that is loaded onto the load lock apparatus; and
 a center calculation section that calculates a center of the wafer from information on the sensor,
 wherein the controller causes the first robot to convey the wafer using the center of the wafer calculated by the center calculation section.

6. The wafer processing apparatus according to claim 5, wherein the chamber module is a film formation apparatus.

7. The wafer processing apparatus according to claim 1, wherein the chamber module is a DCM or a QCM.

8. The wafer processing apparatus according to claim 1, wherein the second robot comprises a first end effector and a second end effector that hold one wafer respectively, and
 the first end effector has a same height as that of the second end effector.

9. The wafer processing apparatus according to claim 1, wherein a concave section having a diameter greater than a diameter of the wafer by 1 mm to 2 mm is formed in the first processing stage and the second processing stage.

10. The wafer processing apparatus according to claim 1, wherein a concave section having a diameter of 301 mm to 302 mm is formed in the first processing stage and the second processing stage.

11. The wafer processing apparatus according to claim 2, wherein a concave section that accommodates a wafer is formed in the first processing stage and the second processing stage and a convex section is formed in an inner wall of the concave section, and
 the controller controls the second robot so as to cause, when placing the wafer on the first processing stage and the second processing stage, a notch or orientation flat of the wafer to face the convex section.

12. A computer readable recording medium that records a program, the program causing a computer to execute:
 a checking step of checking a first position shift amount, which is a position shift of a first processing stage with respect to a load lock apparatus comprising a first load lock stage and a second load lock stage, and a second position shift amount, which is a position shift with respect to the load lock apparatus of a second processing stage provided adjacent to the first processing stage;
 a wafer center detection step of detecting a center of the wafer;
 a shift mounting step of placing a wafer on the first load lock stage so that a center of the wafer is shifted from a center of the first load lock stage by the first position shift amount and placing another wafer on the second load lock stage so that a center of the wafer is shifted from a center of the second load lock stage by the second position shift amount; and
 a mounting step of placing the wafer on the first load lock stage onto the first processing stage simultaneously with placing the wafer on the second load lock stage onto the second processing stage.

13. A wafer conveying method comprising:
 a checking step of checking a first position shift amount, which is a position shift of a first processing stage with respect to a load lock apparatus comprising a first load lock stage and a second load lock stage, and a second position shift amount, which is a position shift with respect to the load lock apparatus of a second processing stage provided adjacent to the first processing stage;
 a center detection step of detecting a center of the wafer;
 a shift mounting step of placing a wafer on the first load lock stage so that a center of the wafer is shifted from a center of the first load lock stage by the first position shift amount and placing another wafer on the second load lock stage so that a center of the wafer is shifted from a center of the second load lock stage by the second position shift amount; and
 a mounting step of placing the wafer on the first load lock stage onto the first processing stage simultaneously with placing the wafer on the second load lock stage onto the second processing stage.

14. The wafer conveying method according to claim 13, wherein a plurality of chamber modules are provided, each of which comprises the first processing stage and the second processing stage, and when processing is performed at one of the chamber modules, a wafer is loaded or unloaded onto/from another of the chamber modules.

15. The wafer conveying method according to claim 13, wherein in the mounting step, the center of the wafer placed on the first processing stage coincides with the center of the first processing stage, and the center of the wafer placed on the second processing stage coincides with the center of the second processing stage.

16. The wafer conveying method according to claim 13, wherein in the center detection step, a notch position or orientation flat position of the wafer is detected, and
 in the mounting step, the notch or orientation flat of the wafer detected in the center detection step is caused to face convex sections formed on an inner wall of the first processing stage and an inner wall of the second processing stage.

\* \* \* \* \*